United States Patent [19]
Clapp, III et al.

[11] Patent Number: 5,467,050
[45] Date of Patent: Nov. 14, 1995

[54] DYNAMIC BIASING CIRCUIT FOR SEMICONDUCTOR DEVICE

[75] Inventors: John S. Clapp, III, Reinholds, Pa.; Wayne T. Chen, Plano, Tex.

[73] Assignee: Texas Instruments Incorporated, Dallas, Tex.

[21] Appl. No.: 177,811

[22] Filed: Jan. 4, 1994

[51] Int. Cl.⁶ .............................. G05F 1/10; H03K 5/08; H03K 19/084
[52] U.S. Cl. ...................... 327/530; 327/535; 327/537; 327/309; 327/314; 327/108; 327/110
[58] Field of Search ................. 307/296.1, 296.5, 307/296.6, 296.8, 270, 540, 563, 448, 458, 317.1, 317.2, 318; 257/267, 280, 471; 327/530, 534, 540, 541, 543, 545, 546, 535, 537, 309, 314, 108, 110

[56] References Cited

U.S. PATENT DOCUMENTS

| | | | |
|---|---|---|---|
| 3,719,797 | 3/1973 | Andrews, Jr. et al. | 307/317.2 |
| 4,160,918 | 7/1979 | Nazarian et al. | 307/317.2 |
| 4,677,325 | 6/1987 | Einzinger et al. | 327/543 |

*Primary Examiner*—Timothy P. Callahan
*Assistant Examiner*—Trong Phan
*Attorney, Agent, or Firm*—Mark E. Courtney; Wade James Brady; Richard L. Donaldson

[57] ABSTRACT

A dynamic biasing circuit is disclosed that includes a blocking current source (20) having a first current path connected to a first node (NODE 1) and a second current path connected to a second node (NODE 3). A linear source follower (22) has a first current path connected to the second node (NODE 3), a second current path connected to a voltage reference (24), and an input connected to the first node (NODE 1). A parasitic capacitor (26) is connected to the first node (NODE 1) and to ground potential, and a parasitic capacitor (28) is connected to the second node (NODE 3) and to ground potential.

20 Claims, 3 Drawing Sheets

DYNAMIC BIASING CIRCUIT FOR SEMICONDUCTOR DEVICE

TECHNICAL FIELD OF THE INVENTION

This invention relates in general to the field of electronic circuits and more particularly to an improved dynamic biasing circuit and method of operation.

BACKGROUND OF THE INVENTION

Semiconductor devices such as bipolar transistors and field effect transistors are widely used in electronic circuits. Use of these semiconductor devices requires that they be properly biased. When biased correctly, these devices operate in predictable ways and are invaluable as elements of electronic circuits.

An electronic circuit with voltage levels that vary beyond the voltage capabilities of semiconductor devices can cause problems with the biasing of these same semiconductor devices. Semiconductor devices often are biased by constant voltage references. This constant biasing prevents undesired biasing of semiconductor devices which can cause the failure of an electronic circuit to perform as desired and even the destruction of some devices. However, in many instances, semiconductor devices are biased in electronic circuits with voltage levels that change with time along with other voltage levels in the electronic circuit. Those changing bias voltage levels can create problems with the proper biasing of the semiconductor device, especially where other bias points of the device are constant voltage levels.

SUMMARY OF THE INVENTION

A need has arisen for a dynamic biasing circuit that allows a semiconductor device to be properly biased when the bias voltages change with time. In accordance with the present invention, a dynamic biasing circuit is provided that substantially eliminates or reduces the disadvantages and problems associated with prior biasing circuits.

According to one embodiment of the present invention, a dynamic biasing circuit is provided that comprises a blocking current source coupled to a first node having a dynamic voltage level and to a second node. The blocking current source is operable to allow current to flow from the first node to the second node and to block current from flowing from the second node to the first node. A linear source follower is coupled to the first node and the second node. A voltage reference having a substantially constant voltage level is coupled to the linear source follower, wherein the linear source follower is operable to connect the second node to the voltage reference when the dynamic voltage level of the first node is below the substantially constant voltage level of the voltage reference and to track a voltage level of the second node to the dynamic voltage level of the first node when the dynamic voltage level of the first node is above the substantially constant voltage level of the voltage reference.

According to another embodiment of the present invention, a dynamic biasing circuit is provided that comprises a controlled blocking current source coupled to a power supply and to a first node and operable to allow current to flow from the power supply to the first node and to block electric current from flowing from the power supply to the first node. A linear source follower is coupled to the first node and to a second node having a dynamic voltage level. A voltage reference having a substantially constant voltage level is coupled to the linear source follower, wherein the linear source follower is operable to connect the first node to the voltage reference when the dynamic voltage level of the second node is below the substantially constant voltage level of the voltage reference and to track a voltage level of the first node to the dynamic voltage level of the second node when the dynamic voltage level of the second node is above the substantially constant voltage level of the voltage reference.

According to another embodiment of the present invention, a method of dynamically biasing a semiconductor device is provided that comprises the following steps. The first step connects a current source to a first node, wherein the current source is operable to allow current to flow to the first node and to block current from flowing out of the first node. The second step connects a linear source follower to the first node and a second node having a dynamic voltage level. The next step connects a voltage reference having a substantially constant voltage level to the linear source follower, wherein the linear source follower is operable to connect the first node to the voltage reference when the dynamic voltage level of the second node is below the substantially constant voltage level of the voltage reference and to track a voltage level of the first node to the dynamic voltage level of the second node when the dynamic voltage level of the second node is above the substantially constant voltage level of the voltage reference. The last step connects the first node to a semiconductor device to dynamically bias the semiconductor device.

BRIEF DESCRIPTION OF THE DRAWINGS.

A more complete understanding of the present invention and the advantages thereof may be acquired by referring to the following-description taken in conjunction with the accompanying drawings, in which like reference numbers indicate like features and wherein.

DETAILED DESCRIPTION OF THE INVENTION

Activation of parasitic diodes can occur when a p-channel field effect transistor is biased such that its source or drain voltage levels change with respect to time. In many instances, a p-channel field effect transistor is built with its source and drain as p+ regions in an n-well on a p− substrate. Changing the voltage levels of the source and drain can cause problems due to the parasitic diodes formed by the regions of the device. In many instances, the n-well, or backgate, is statically biased by tying the backgate to the source. This bias prevents the activation of a parasitic diode between the p+ source and the backgate. The backgate can also be statically biased by tying the backgate to the most positive voltage source in the electronic circuit. This bias also ensures that no parasitic diode will be activated between the source and the n-well. Both static biasing schemes for a p-channel field effect transistor cause problems with the device if the voltage at the source of the device goes negative. The backgate cannot be tied to the most positive potential because of p+ source or drain breakdown to the n-well. Thus, dynamic biasing is needed.

The present invention operates to dynamically bias a semiconductor transistor device to prevent undesired activation of parasitic diodes within the device structure and to prevent source and drain junction breakdowns to the n-well backgate.

Figure 1:
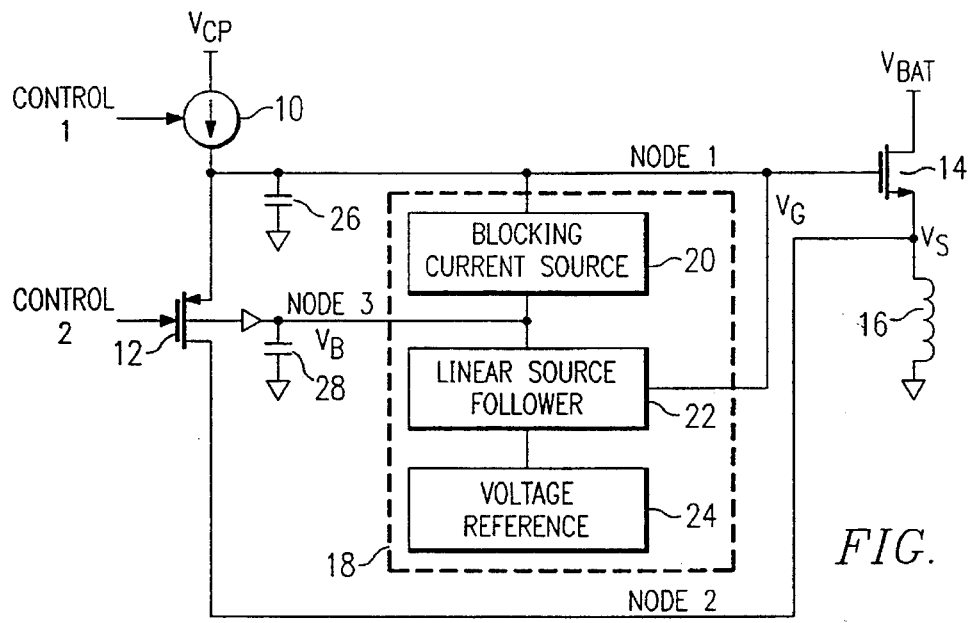
FIG. 1 illustrates an electronic circuit including one embodiment of a dynamic biasing circuit constructed according to the teachings of the present invention.

Referring to FIG. 1, a controlled current source 10 is controlled by a control signal CONTROL 1. The controlled current source 10 has two terminals. One is connected to a positive power supply $V_{CP}$. The second terminal of the controlled current source 10 is connected to NODE 1. A p-channel field effect transistor (P-FET) 12 has its gate connected to a control signal CONTROL 2. The P-FET 12 has its drain connected to NODE 2, its source connected to a NODE 1, and its backgate connected to a NODE 3. An n-channel field effect transistor (N-FET) 14 has its drain connected to a positive power supply $V_{BAT}$. The source of the N-FET 14 is connected to NODE 2, and its gate is connected to NODE 1. An inductive load 16 has two terminals. One is connected to NODE 2, and the other is connected to ground potential. A dynamic biasing circuit 18 constructed according to the teachings of the present invention has a blocking current source 20. The blocking current source has a first current path connected to NODE 1, and a second current path connected to NODE 3. A linear source follower 22 has an input connected to NODE 1, a first current path connected to NODE 3, and a second current path connected to a voltage reference 24. NODE 1 has a parasitic capacitor 26 connected to NODE 1 and to ground potential. Parasitic capacitor 26 is not a circuit element, but is the capacitance that exists at NODE 1 as a parasitic of the circuit. NODE 2 has a parasitic capacitor 28 connected to NODE 2 and to ground potential. Parasitic capacitor 28 is also a parasitic of the circuit.

In operation, the electronic circuit illustrated in FIG. 1 operates to flux and deflux the inductive load 16. When fluxing, the CONTROL 1 signal turns on controlled current source 10, and the CONTROL 2 signal turns off P-FET 12. In this state, controlled current source 10 supplies current to NODE 1. The blocking current source 20 operates to allow current to flow from NODE 1 to NODE 3 but not to allow current to flow from NODE 3 to NODE 1. The voltage across blocking current source 20 is not fixed. The voltage level of NODE 3 tracks NODE 1 because the parasitic capacitance 28 at NODE 3 is much less than the parasitic capacitance 22 at NODE 1. In other words, the change in voltage at NODE 3 with respect to time is greater than that of NODE 1. Thus, the voltage level, $V_B$, of NODE 3 is nearly identical to the voltage level, $V_G$, of NODE 1. The fact that $V_B$ is approximately equal to $V_G$ ensures that a parasitic diode between the source and backgate of the P-FET 12 does not activate.

The voltage levels $V_B$ and $V_G$ rise as the controlled current source 10 supplies current to NODE 1 and the blocking current source 20 allows current to flow to NODE 3. The linear source follower 22 uses the voltage level $V_G$ as an input. When $V_G$ is above or within one threshold voltage beneath NODE 3, the linear source follower 22 operates as an open circuit between NODE 3 and the voltage reference 24 and operates to track $V_B$ of NODE 3 with $V_G$ of NODE 1. The N-FET 14 is turned on as $V_G$ rises and operates as a closed circuit between $V_{BAT}$ and NODE 2. Current flows into the inductive load 16, fluxing the inductive load 16 when the N-FET 14 is on. Because P-FET 12 is off, it operates as an open circuit between NODE 1 and NODE 2. Therefore, no current flows from the inductive load 16 through P-FET 12. In this way, the circuit operates to flux the inductive load 16 while the CONTROL 1 signal turns on the controlled current source 10 and the CONTROL 2 signal turns off the P-FET 12.

To deflux the inductive load 16, the CONTROL 1 signal turns the controlled current source 10 off, and the CONTROL 2 signal turns the P-FET 12 on. Once on, the P-FET 12 attempts to operate as a closed circuit between NODE 1 and NODE 2. Consequently, the gate source voltage of N-FET 14 is diminished, and N-FET 14 is unable to supply the necessary current required by the inductive load 16. With N-FET 14 operated in this manner, a reduced current flows from $V_{BAT}$ to NODE 2. The inductive load 16 resists a change in the current flowing through the inductive load 16 and draws current from the P-FET 12. As current flows from NODE 1 through the P-FET 12 to NODE 2 through the inductive load 16, the voltage levels $V_G$ of NODE 1 and $V_S$ of NODE 2 drop. The voltage level, $V_B$, at NODE 3, drops along with $V_G$. The voltage levels, $V_B$ and $V_G$, both drop until $V_B$ reaches the substantially constant voltage level of the voltage reference 24. When $V_G$ drops below the voltage level of the voltage reference 24, the linear source follower 22 operates as a closed circuit between NODE 3 and the voltage reference 24. The linear source follower 22 and the voltage reference 24 operate to set NODE 3 to the substantially constant voltage level set by the voltage reference 24. When $V_G$ drops below the substantially constant voltage level of the voltage reference 24, the blocking current source 20 does not allow current to flow from NODE 3 to NODE 1. Therefore, the voltage level at NODE 3 remains set to the level of the voltage reference 24, and the voltage level at NODE 1 is allowed to continue to traverse negative.

The inductive load 16 continues to pull the voltage levels $V_G$ and $V_S$ down until $V_G$ and $V_S$ reach a negative value. At this point, the inductive load 16 has been defluxed, and the voltage level $V_S$ of NODE 2 is at a relatively large negative value. The voltage level $V_G$ does not drop as low as the voltage level $V_S$ of NODE 2. As the inductive load 16 pulls current from NODE 2, P-FET 12 begins to act as a capacitor. Thus, charge is pulled from NODE 2 through the inductive load 16, but charge at NODE 1 remains. The clamping of NODE 3 to the substantially constant voltage level of the voltage reference 24 ensures that a parasitic diode between the substrate and the backgate of the P-FET 12 does not conduct current, and a parasitic diode between the backgate and source or between the backgate and drain of P-FET 12 does not reverse breakdown.

The dynamic biasing circuit 18 constructed according to the teachings of the present invention operates in the electronic circuit of FIG. 1 to ensure that a parasitic diode between the drain and the backgate of the P-FET 12 does not activate during fluxing of the inductive load 16 when the voltage level of NODE 1 is approximately equal to the positive power supply $V_{CP}$. The dynamic biasing circuit 18 also ensures that during defluxing of the inductive load 16, when NODE 1 drops to a relatively large negative value, a parasitic diode between the backgate and the source or the backgate and the drain of the P-FET 12 does not reverse breakdown, and the parasitic diode between backgate and substrate does not activate. In this way, the present invention provides dynamic biasing of the P-FET 12 such that no activation of parasitic diodes within the structure of P-FET 12 occurs.

Figure 2:
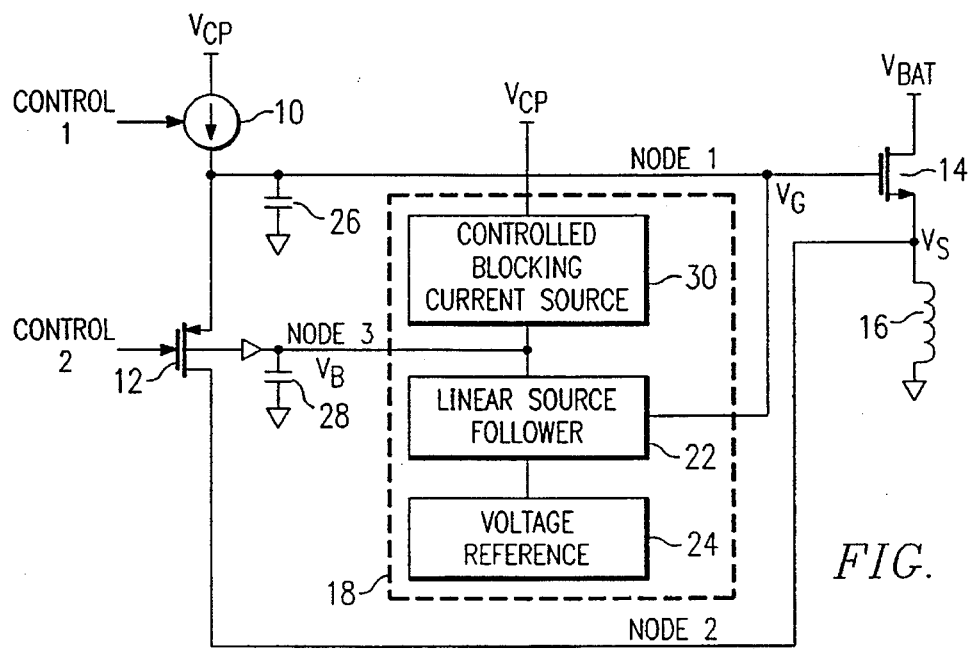
FIG. 2 illustrates an electronic circuit including another embodiment of a dynamic biasing circuit constructed according to the teachings of the present invention.

FIG. 2 illustrates an electronic circuit including another embodiment of a dynamic biasing circuit 18 constructed according to the teachings of the present invention. The electronic circuit of FIG. 2 is substantially similar to the circuit of FIG. 1. The difference between the electronic circuit of FIG. 1 and the electronic circuit of FIG. 2 is the structure of the dynamic biasing circuit 18. The blocking current source 20 of FIG. 1 is replaced with a controlled blocking current source 30 in FIG. 2. Both of the dynamic biasing circuits 18 of FIGS. 1 and 2 comprise a current source operable to block current from flowing either into or out of the backgate of P-FET 12. The dynamic biasing circuit 18 of FIG. 1 comprises a blocking current source, and the dynamic biasing circuit of FIG. 2 comprises a controlled blocking current source, as illustrated in FIGS. 1 and 2, as discussed above. The controlled blocking current source 30 has a first current path connected to the positive power supply $V_{CP}$ and a second current path connected to the linear source follower 22. The electronic circuit of FIG. 2 operates as described above with respect to the circuit of FIG. 1, except for the controlled blocking current source 30 and the voltage level, $V_B$, of NODE 3.

When controlled current source 10 is on, and the inductive load 16 is being fluxed, the controlled blocking current source 30 turns on and provides current to NODE 3. The controlled blocking current source 30 drives the voltage level $V_B$ of NODE 3 up to the level of the voltage supply $V_{CP}$. Thus, the voltage level of NODE 3 remains higher than or equal to the voltage level $V_G$ of NODE 1 as $V_G$ rises to $V_{CP}$. The fact that $V_S$ remains equal to or above $V_G$ ensures that no parasitic diode between the backgate and the source of P-FET 12 is activated. As described above with reference to FIG. 1, linear source follower 22 is off while $V_G$ is above or within one threshold voltage beneath NODE 3, and linear source follower 22 operates as an open circuit between NODE 3 and the voltage reference 24 and to track $V_B$ of NODE 3 to $V_G$ of NODE 1.

When the inductive load 16 is being defluxed, the controlled current source 10 is off, and P-FET 12 is on, the controlled blocking current source 30 turns off. Thus, NODE 3 remains at $V_{CP}$ until $V_G$ drops so that the threshold voltage between NODE 3 and $V_G$ is sufficient for the linear source follower 22 to turn on. The linear source follower 22 sets NODE 3 to the substantially constant voltage level of the voltage reference 24, as discussed above with reference to FIG. 1. NODE 3 is set to the substantially constant voltage level of voltage reference 24 when the controlled blocking current source 30 is turned off. The controlled blocking current source 30 is turned off when the CONTROL 1 signal turns off the controlled current source 10 to ensure that no current flows from $V_{CP}$ to recharge NODE 3. NODE 3 is clamped to the substantially constant voltage level of the voltage reference 24, and the circuit operates otherwise as discussed with reference to FIG. 1.

A technical advantage of the dynamic biasing circuits 18 of FIGS. 1 and 2 is the prevention of the activation of parasitic diodes in P-FET 12 of FIGS. 1 and 2, respectively, by biasing the backgate of P-FET 12.

Figure 3:
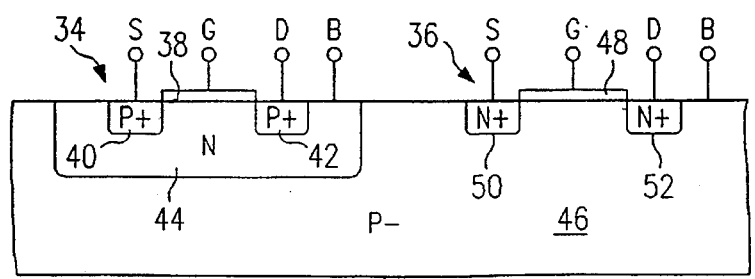
FIG. 3 illustrates a physical structure of a p-channel and an n-channel field effect transistor built upon a p-type semiconductor substrate.

Referring to FIG. 3, a physical structure of a p-channel field effect transistor (P-FET) 34 and an n-channel field effect transistor (N-FET) 36 are shown where the P-FET 34 and the N-FET 36 are formed on a p– substrate. The P-FET 34 comprises a gate 38, and two p+ regions which act as the source 40 and the drain 42 of the device. These p+ regions are set in an n-well which is the backgate 44 of the device. The P-FET 34 is formed on a p– substrate 46. The N-FET 36 comprises a gate 48 the N-FET 36 further comprises two n+ regions which act as the source 50 and the drain 52 of the device. The N-FET 36 also is formed on the p-substrate 46.

In operation, P-FET 34 and N-FET 36 function in the manner of standard field effect transistors. Gate 38, source 40 and drain 42 are the gate, source and drain of a p-channel field effect transistor. The substrate 46 is connected to ground potential. A negative voltage level applied across the gate 38 and source 40 turns on P-FET 34 and allows current to flow from the source 40 to the drain 42. The N-FET 36 has a source 50, a drain 52, and a gate 48. A positive voltage level applied across the gate 48 and the source 50 turns on N-FET 36 and allows conduction of current from the drain 52 to the source 50.

Figure 4:
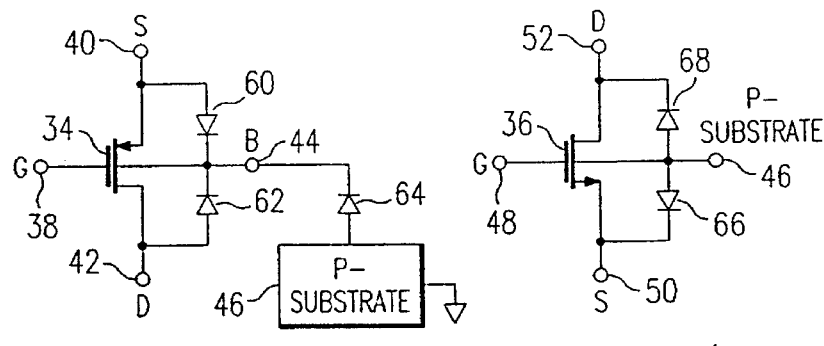
FIG. 4 illustrates parasitic diodes that exist in the physical structure illustrated in FIG. 3.

FIG. 4 illustrates the parasitic diodes that exist within the physical structure of the p-channel and n-channel field effect transistors of FIG. 3. The P-FET 34 and the N-FET 36 are illustrated in FIG. 4 as circuit elements but have the physical structure illustrated in FIG. 3. In a semiconductor device, a p region and an n region joined together form a diode with the anode at the p region and the cathode at the n region. A positive voltage level across the p/n junction greater than the turn on voltage level of the diode will activate the diode. Thus, if a large enough positive voltage level is set up across a p/n junction in the physical structure shown in FIG. 3, a diode will activate. The diodes illustrated in FIG. 4 are not part of the planned function of the structure and are thus called "parasitic diodes." As shown in FIG. 4, a parasitic diode 60 has the source 40 of the P-FET 34 as an anode and the backgate 44 as a cathode. P-FET 34 also comprises a parasitic diode 62 that has the drain 42 as an anode and the backgate 44 as a cathode and a parasitic diode 64 that has the p-substrate 46 as an anode and the backgate 44 as a cathode. The N-FET 36 comprises two parasitic diodes. Parasitic diode 66 has the substrate 46 of the N-FET 36 as an anode and the source 50 as a cathode, and parasitic diode 68 has the substrate 46 of the N-FET 36 as an anode and the drain 52 as a cathode.

In operation, if the voltage level across any of the parasitic diodes becomes greater than the turn-on voltage of a p/n junction diode, the parasitic diodes will activate. Once activated, a parasitic diode causes current to flow from the p region into the n region across the p-n junction. If one of these parasitic diodes were allowed to activate, the proper function of the P-FET 36 or N-FET 38 would be degraded.

Figure 5:
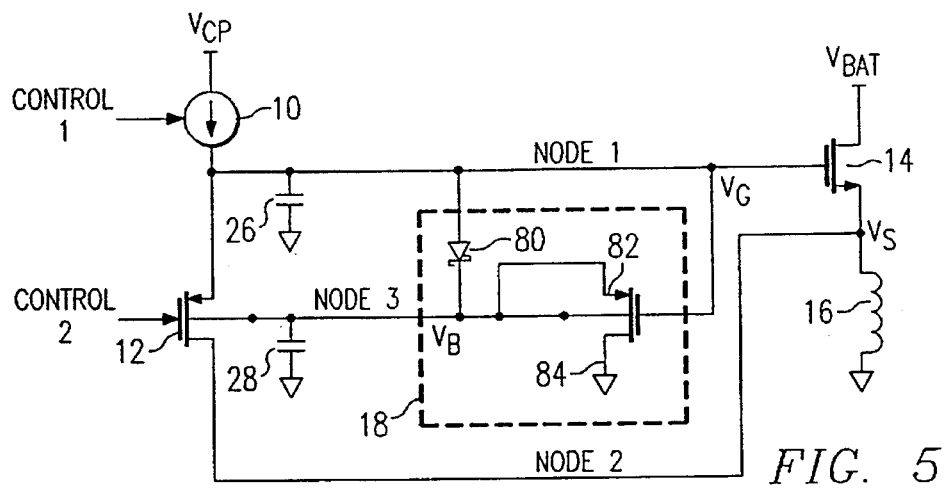
FIG. 5 illustrates an electronic circuit including another embodiment of a dynamic biasing circuit constructed according to the teachings of the present invention.

FIG. 5 illustrates another embodiment of a dynamic biasing circuit constructed according to the teachings of the present invention. The electronic circuit of FIG. 5 has the topology of the circuit illustrated in FIG. 1 and illustrates one specific manner of constructing the dynamic biasing circuit 18. Referring to FIG. 5, a Schottky diode 80 comprises an anode connected to NODE 1 and a cathode connected to NODE 3. A p-channel field effect transistor (P-FET) 82 has a gate connected to NODE 1, a source connected to NODE 3, a drain connected to a ground potential 84, and a backgate connected to NODE 3. The ground potential 84 supplies a constant voltage level.

In operation, the Schottky diode 80, the P-FET 82, and the ground potential 84 function to dynamically bias the backgate of the P-FET 12. The inductive load 16 is fluxed when the CONTROL 1 signal turns on the controlled current source 10. As the voltage level $V_G$ of NODE 1 increases, the Schottky diode 80 allows current to flow from NODE 1 to NODE 3. The current charges NODE 3, and the voltage level $V_B$ of NODE 3 rises. As the voltage level $V_G$ increases, the voltage $V_B$ also rises because the two are linked by the Schottky diode 80. The Schottky diode 80 operates to keep $V_B$ roughly equal to $V_G$. This ensures that the parasitic diode between the drain and backgate of the P-FET 12 does not activate. The Schottky diode 80 also ensures that the parasitic diode between the backgate and the source and the backgate and the drain do not break down.

As the inductive load 16 is defluxed, $V_G$ drops towards ground potential. When $V_G$ drops below ground potential, P-FET 82 is turned on. When P-FET 82 turns on, the P-FET 82 clamps NODE 3 to the ground potential 84. Thus, the ground potential 84 serves as a substantially constant voltage level clamping the voltage level of NODE 3. Once NODE 3 is clamped to ground potential 84, the Schottky diode 80 acts to block current from flowing from NODE 3 into NODE 1. Thus, as $V_G$ drops negative below ground potential, no current flows from NODE 3 to NODE 1. This ensures that the parasitic diode between the backgate and the substrate does not activate because both NODE 3 and the substrate are tied to ground potential.

Figure 6:
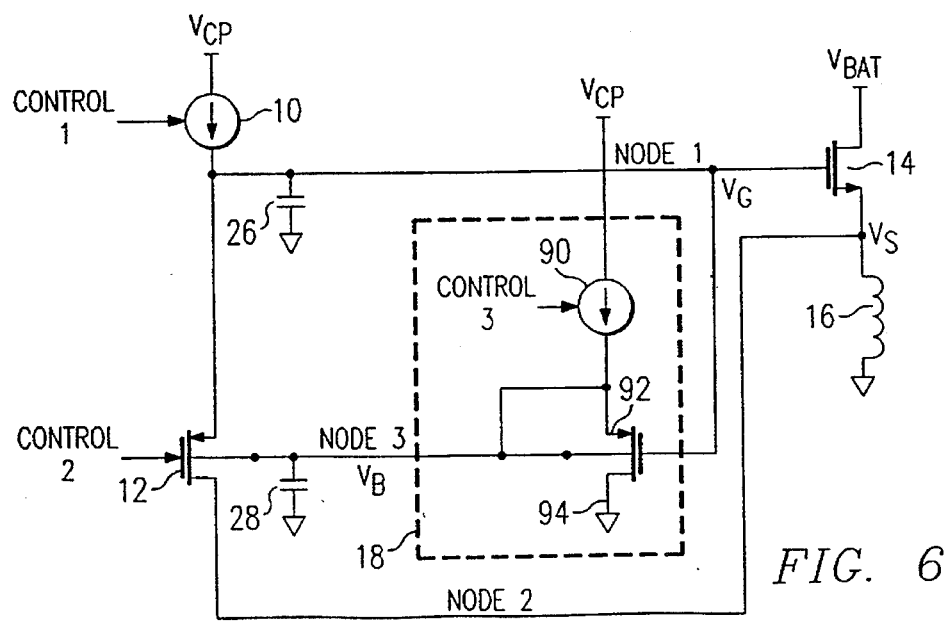
FIG. 6 illustrates an electronic circuit including another embodiment of a dynamic biasing circuit of the present invention.

FIG. 6 illustrates another embodiment of a dynamic biasing circuit constructed according to the teachings of the present invention. The electronic circuit of FIG. 6 has the topology of the circuit illustrated in FIG. 2 and illustrates one specific manner of constructing the dynamic biasing circuit. A controlled current source 90 has a first input connected to power supply $V_{CP}$, an output connected to NODE 3, and a second input. A p-channel field effect transistor (P-FET) 92 has a source connected to NODE 3, a gate connected to NODE 1, a drain connected to a ground potential 94, and a backgate connected to NODE 3. The ground potential 94 supplies a substantially constant voltage reference.

The controlled current source 90 operates in a similar manner to the controlled blocking current source 30 described with reference to FIG. 2. When CONTROL 1 turns on the controlled current source 10, CONTROL 3 turns on the controlled current source 90. Thus, while the voltage level $V_G$ of NODE 1 rises, the voltage level $V_B$ to NODE 3 rises as well. This also ensures that $V_B$ and $V_G$ remain roughly equal as the inductive load 16 is fluxed. Thus, the parasitic diode between the drain and the backgate of the P-FET 12 does not become activated. When the inductive load 16 is being defluxed, CONTROL 1 turns off controlled current source 10, and CONTROL 3 turns off the controlled current source 90. The controlled current source 90 then becomes an open circuit blocking current flow from the voltage supply $V_{CP}$ into NODE 3. When $V_G$ drops below ground potential 94, P-FET 82 is turned on and clamps NODE 3 to ground 94. Once NODE 3 is clamped to ground potential 94, no current flows into NODE 3 because the controlled current source 90 acts as an open circuit.

Figure 7:
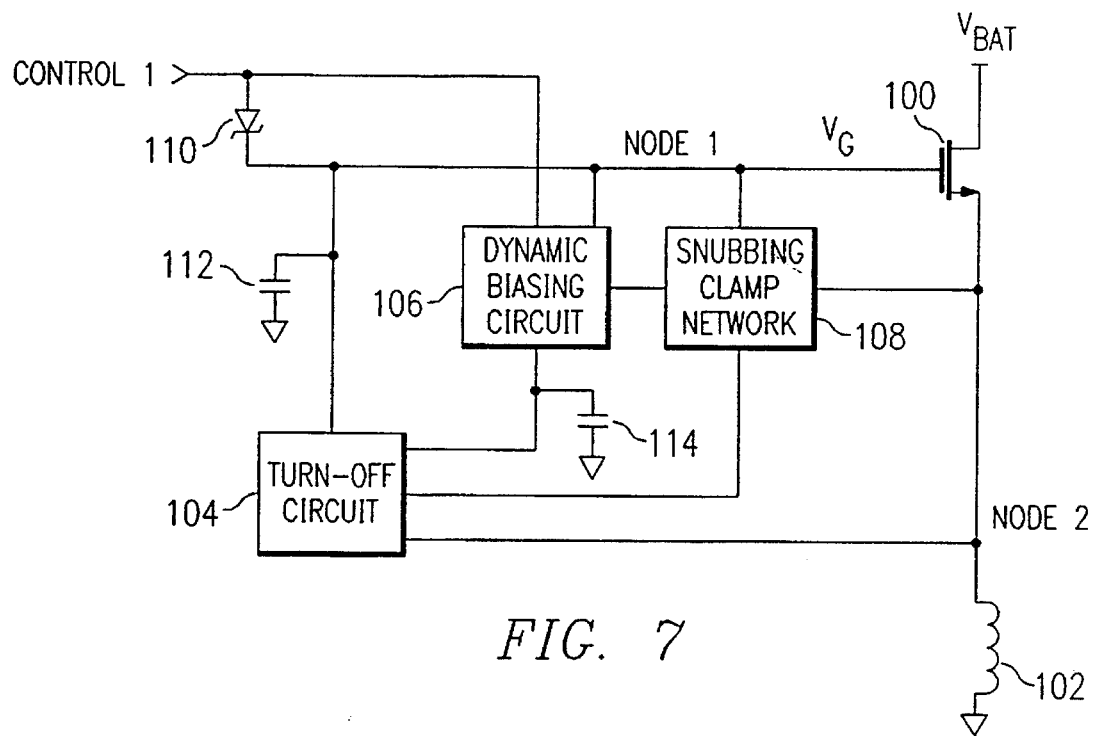
FIG. 7 illustrates an integrated high side driver circuit constructed according to the teachings of the present invention.

FIG. 7 illustrates an integrated high side driver circuit constructed according to the teachings of the present invention. An n-channel field effect transistor (N-FET) 100 has its drain coupled to a power supply voltage $V_{BAT}$, its gate coupled to a NODE 1 and its source coupled to a NODE 2.

The voltage level of NODE i is $V_G$, and the voltage level of NODE 2 is $V_S$. An inductive load 102 is coupled to NODE 2 and to ground potential. A control signal CONTROL 1 is coupled to NODE 1 and thus to the gate of the N-FET 100. A turn-off circuit 104 is coupled to NODE 1, to NODE 2 and to a dynamic biasing circuit 106 as shown. A snubbing clamp network 108 is coupled to NODE 1, NODE 2 and the dynamic biasing circuit 106 as shown. A parasitic capacitor 112 is coupled to NODE 1 and to ground potential, and a parasitic capacitor 114 is coupled to the turn-off circuit 104 and the dynamic biasing circuit 106 as shown.

In operation, the integrated high side driver circuit operates to drive the inductive load 102. The dynamic biasing circuit 106 operates as described above to provide dynamic biasing to the turn-off circuit 104 and the snubbing clamp network 108. One possible embodiment of the turn-off circuit 104 is described in application Ser. No. 08/176,815, entitled "TURN-OFF CIRCUIT" (Texas Instruments Reference No. TI- 18393), filed concurrently with the present invention on Jan. 4, 1994, the disclosure of which is hereby incorporated by reference into the disclosure of the present application as if fully set forth herein. One possible embodiment of snubbing clamp network 108 is described in application Ser. No. 08/176,816, entitled "SNUBBING CLAMP NETWORK" (Texas Instruments Reference No. TI-17750) filed concurrently with the present invention on Jan. 4, 1994, the disclosure of which is hereby incorporated by reference into the disclosure of the present application as if fully set forth herein.

Figure 8:
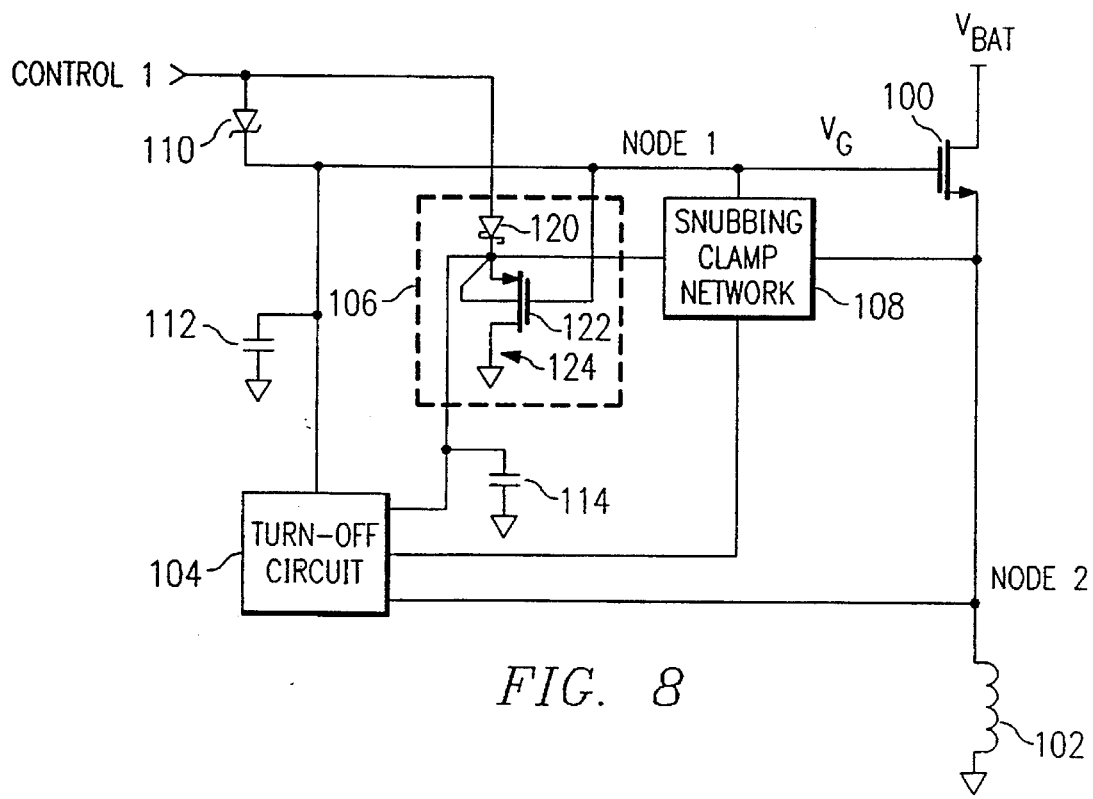
FIG. 8 illustrates another embodiment of an integrated high side driver circuit constructed according to the teachings of the present invention.

FIG. 8 illustrates an integrated high-side driver circuit constructed according to the teachings of the present invention. The circuit of FIG. 8 has the topology of that illustrated in FIG. 7 and illustrates one specific manner of constructing dynamic biasing circuit 106. The dynamic biasing circuit 106 illustrated in FIG. 8 comprises a Schottky diode 120 with an anode coupled to CONTROL 1 and a cathode coupled to a p-channel field effect transistor (P-FET) 122. The P-FET 122 has a source coupled to the anode of the Schottky diode, a drain coupled to a ground potential 124, a gate coupled to NODE 1 and a backgate coupled to the Schottky diode. This dynamic biasing circuit 106 has the same configuration as that illustrated in FIG. 5. The dynamic biasing circuit 106 operates as described with reference to FIG. 5. The dynamic biasing provided by the dynamic biasing circuit 106 is supplied to both the snubbing clamp network 108 and the turn-off circuit 104. One possible embodiment of turn-off circuit 104 is described in application Ser. No. 08/176,815, entitled "TURN-OFF CIRCUIT" (Texas Instruments Reference No. TI-18393) filed concurrently herewith on Jan. 4, 1994. One possible embodiment of snubbing clamp network 108 is described in application Ser. No. 08/176,816, entitled "SNUBBING CLAMP NETWORK" (Texas Instruments Reference No. TI-17750) filed concurrently herewith on Jan. 4, 1994.

Although the present invention has been described in detail, it should be understood that various changes, substitutions, and alterations can be made without departing from the spirit and scope of the invention, as defined by the appended claims.

What is claimed is:

1. A dynamic biasing circuit, comprising:
   a blocking current source coupled to a first node having a dynamic voltage level and to a second node, the blocking current source operable to allow current to flow from the first node to the second node and to block current from flowing from the second node to the first node;

a linear source follower coupled to the first node and the second node; and a voltage reference having a substantially constant voltage level coupled to the linear source follower, wherein the linear source follower is operable to couple the second node to the voltage reference when the dynamic voltage level of the first node is below the substantially constant voltage level of the voltage reference and alternatively to cause the voltage level of the second node to substantially track the dynamic voltage level of the first node when the dynamic voltage level of the first node is above the substantially constant voltage level of the voltage reference.

2. The dynamic biasing circuit of claim 1, wherein the blocking current source comprises a diode having an anode coupled to the first node and a cathode coupled to the second node.

3. The dynamic biasing circuit of claim 1, wherein the blocking current source comprises a Schottky diode having an anode coupled to the first node and a cathode coupled to the second node.

4. The dynamic biasing circuit of claim 1, wherein the linear source follower comprises a transistor having an input coupled to the first node, a first current path coupled to the second node and a second current path coupled to the voltage reference.

5. The dynamic biasing circuit of claim 1, wherein the linear source follower comprises a p-channel field effect transistor having a source coupled to the second node, a drain coupled to the voltage reference, a gate coupled to the first node and a backgate coupled to the second node.

6. The dynamic biasing circuit of claim 1, wherein the voltage reference comprises a circuit ground potential.

7. A dynamic biasing circuit, comprising:

a controlled blocking current source coupled to a power supply and to a first node and operable to allow current to flow from the power supply to the first node and to block electric current from flowing from the power supply to the first node;

a linear source follower coupled to the first node and to a second node having a dynamic voltage level; and a voltage reference having a substantially constant voltage level coupled to the linear source follower, wherein the linear source follower is operable to couple the first node to the voltage reference when the dynamic voltage level of the second node is below the substantially constant voltage level of the voltage reference and alternatively to cause the voltage level of the second node to substantially track the dynamic voltage level of the first node when the dynamic voltage level of the second node is above the substantially constant voltage level of the voltage reference.

8. The dynamic biasing circuit of claim 7, wherein the controlled blocking current source comprises:

a controlled current source coupled to the power supply and to the first node; and a control signal coupled to the controlled current source operable to activate and deactivate the controlled current source.

9. The dynamic biasing circuit of claim 7, wherein the linear source follower comprises a transistor having an input coupled to the first node, a first current path coupled to the second node and a second current path coupled to the voltage reference.

10. The dynamic biasing circuit of claim 7, wherein the linear source follower comprises a p-channel field effect transistor having a source coupled to the first node, a drain coupled to the voltage reference, a gate coupled to the second node and a backgate coupled to the first node.

11. The dynamic biasing circuit of claim 7, wherein the voltage reference comprises a circuit ground potential.

12. A method of dynamically biasing a semiconductor device, comprising the steps of:

connecting a current source to a first node, wherein the current source is operable to allow current to flow to the first node and to block current from flowing out of the first node;

connecting a linear source follower to the first node and a second node having a dynamic voltage level;

connecting a voltage reference having a substantially constant voltage level to the linear source follower, wherein the linear source follower is operable to couple the first node to the voltage reference when the dynamic voltage level of the second node is below the substantially constant voltage level of the voltage reference and alternatively to cause the voltage level of the second node to substantially track the dynamic voltage level of the first node when the dynamic voltage level of the second node is above the substantially constant voltage level of the voltage reference; and connecting the first node to a semiconductor device to dynamically bias the semiconductor device.

13. The method of claim 12, wherein the current source comprises a diode having an anode coupled to the second node and a cathode coupled to the first node.

14. The method of claim 12, wherein the current source comprises a Schottky diode having an anode coupled to the second node and a cathode coupled to the first node.

15. The method of claim 12, wherein the current source comprises:

a controlled current source coupled to a power supply and to the first node; and a control signal coupled to the controlled current source operable to turn on and to turn off the controlled current source.

16. The method of claim 12, wherein the linear source follower comprises a transistor having an input coupled to the second node, a first current path coupled to the first node and a second current path coupled to the voltage reference.

17. The method of claim 12, wherein the linear source follower comprises a p-channel field effect transistor having a source coupled to the first node, a drain coupled to the voltage reference, a gate coupled to the second node and a backgate coupled to the first node.

18. The method of claim 12, wherein the voltage reference comprises a circuit ground potential.

19. The method of claim 12, wherein the semiconductor device is a transistor.

20. The method of claim 12, wherein the semiconductor device is a p-channel field effect transistor built on a p-substrate in an n-well and wherein the n-well of the p-channel field effect transistor is coupled to the first node to dynamically bias the p-channel field effect transistor.

* * * * *